(12) United States Patent
Jiang

(10) Patent No.: US 11,721,785 B2
(45) Date of Patent: Aug. 8, 2023

(54) MASS TRANSFER APPARATUS, MASS TRANSFER SYSTEM, AND CONTROL METHOD FOR MASS TRANSFER

(71) Applicant: CHONGQING KONKA PHOTOELECTRIC TECHNOLOGY RESEARCH INSTITUTE CO., LTD., Chongqing (CN)

(72) Inventor: Guang Ping Jiang, Chongqing (CN)

(73) Assignee: CHONGQING KONKA PHOTOELECTRONIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 137 days.

(21) Appl. No.: 17/347,096

(22) Filed: Jun. 14, 2021

(65) Prior Publication Data

US 2021/0367095 A1    Nov. 25, 2021

Related U.S. Application Data

(63) Continuation of application No. PCT/CN2020/092432, filed on May 26, 2020.

(51) Int. Cl.
| | |
|---|---|
| *B32B 43/00* | (2006.01) |
| *H01L 33/00* | (2010.01) |
| *G02B 7/02* | (2021.01) |

(52) U.S. Cl.
CPC ........ *H01L 33/0093* (2020.05); *B32B 43/006* (2013.01); *G02B 7/023* (2013.01); *Y10T 156/1158* (2015.01); *Y10T 156/1917* (2015.01)

(58) Field of Classification Search
CPC ............. B32B 43/006; Y10T 156/1158; Y10T 156/1917
See application file for complete search history.

(56) References Cited

U.S. PATENT DOCUMENTS 3,882,462 A * 5/1975 McMahon ............. G06V 10/88
382/212
4,283,145 A * 8/1981 Miyazawa ............. G01N 21/90
359/201.1
(Continued)

FOREIGN PATENT DOCUMENTS

| CN | 107390392 A | 11/2017 |
|---|---|---|
| CN | 109545815 A | 3/2019 |

(Continued)

OTHER PUBLICATIONS

International Search Report issued in corresponding International Application No. PCT/CN2020/092432, dated Jan. 29, 2021, pp. 1-10, Beijing, China.

*Primary Examiner* — Philip C Tucker
*Assistant Examiner* — Nickolas R Harm
(74) *Attorney, Agent, or Firm* — Hauptman Ham, LLP

(57) ABSTRACT

A mass transfer apparatus, a mass transfer system, and a control method for mass transfer are provided. The mass transfer apparatus includes a beam emission assembly, a rotating lens, and a rotating lens adjusting assembly. The rotating lens is configured to receive the beam emitted from the beam emission assembly. The rotating lens adjusting assembly is connected with the rotating lens. The rotating lens adjusting assembly is configured to control the rotating lens to perform peripheral rotation. The rotating lens adjusting assembly is also configured to adjust a rotation radius of the rotating lens.

20 Claims, 3 Drawing Sheets

(56) References Cited

U.S. PATENT DOCUMENTS

| | | | | |
|---|---|---|---|---|
| 7,298,556 B2 * | 11/2007 | Cho | ................. | H04N 9/3117 |
| | | | | 359/623 |
| 2011/0188016 A1 * | 8/2011 | De Jager | ............ | G03F 7/70275 |
| | | | | 355/55 |

FOREIGN PATENT DOCUMENTS

| | | | | | |
|---|---|---|---|---|---|
| JP | | 2010278051 A | | 12/2010 | |
| KR | | 20130042894 A | | 4/2013 | |
| WO | WO-2006066138 A2 * | | 6/2006 | ............ | G01N 21/21 |

* cited by examiner

MASS TRANSFER APPARATUS, MASS TRANSFER SYSTEM, AND CONTROL METHOD FOR MASS TRANSFER

CROSS-REFERENCE TO RELATED APPLICATION(S)

This application is a continuation of International Application No. PCT/CN2020/092432, filed on May 26, 2020, which claims priority to Chinese Patent Application No. 202010444385.6, filed on May 22, 2020, the disclosures of which are hereby incorporated by reference in their entireties.

TECHNICAL FIELD

The present application relates to the field of semiconductor technology, in particular to a mass transfer apparatus, a mass transfer system, and a control method for mass transfer.

BACKGROUND

Micro light emitting diodes (micro-LED) relate to a new generation of display technology. Compared with the related organic light-emitting diode (OLED), the micro-LED has higher brightness and better luminous effect but lower power consumption. The micro-LED technology, i.e. the LED miniaturization and arraying technology, refers to the integration of high-density and small-size miniaturized versions of LEDs on a chip, which reduces a pixel distance from millimeters to micrometers. In the micro-LED technology, a miniaturized LED is manufactured as follows. First, an LED structure design is thinned, miniaturized, and arrayed, so that the size of the miniaturized LED is around 1-250 um. Then, miniaturized red, green, and blue LED microelements are transferred in batches to a circuit board. Next, a protective layer and an upper electrode are deposited with a physical deposition method. Finally, encapsulation is conducted with an upper substrate. Among the above, transferring the LED microelements to the circuit board in batches is critical.

At present, a laser lift-off technology is generally used to carry out the mass transfer of micro-LEDs. LED assemblies to be transferred include a release layer, an adhesive layer, an LED chip, a first temporary substrate, and a second temporary substrate. The release layer can be formed by using, for example, fluorine coating, silicone resin, water-soluble adhesive (such as PVA), poly Imide, etc. The laser selectively irradiates the release layer where the LED to be transferred locates to make it lose its viscosity or vaporize directly, so that the LED to be transferred is stripped off from the first temporary substrate and adhered to the second temporary substrate.

The laser lift-off technology currently used for the micro-LED is a galvanometer scanning method. The position of a spot is controlled by controlling mirrors in X-axis and Y-axis. However, it is sensitive to external vibration, stress, and motor accuracy, so it is difficult to realize precise control of the trajectory of the spot.

Therefore, in the laser lift-off technology, how to improve the accuracy of spot control is a problem that needs to be solved.

SUMMARY

According to a first aspect, a mass transfer apparatus is provided. The mass transfer apparatus includes a beam emission assembly, a rotating lens, and a rotating lens adjusting assembly. The beam emission assembly is configured to emit a beam. The rotating lens is configured to receive the beam emitted from the beam emission assembly and refract the beam to a substrate carrying a micro light emitting diode (LED) chip to be stripped. The rotating lens adjusting assembly is connected with the rotating lens and configured to control the rotating lens to perform peripheral rotation and adjust a rotation radius of the rotating lens.

In an embodiment, the rotating lens adjusting assembly includes a driving mechanism and a length adjusting support assembly with one end connected with the driving mechanism and the other end connected with the rotating lens. The length adjusting support assembly is configured to rotate around a rotation axis of the driving mechanism driven by the driving mechanism, so that the rotating lens rotates around the rotation axis of the driving mechanism along with the length adjusting support assembly, and adjust the length of a part thereof connected with the driving mechanism to control the rotation radius of the rotating lens when receiving a signal for adjusting the rotation radius of the rotating lens.

In an embodiment, the length adjusting support assembly includes a telescopic slide bar mechanism that is length-adjustable and connected with the driving mechanism, and the length adjusting support assembly is configured to adjust the length of the telescopic slide bar mechanism to adjust the rotation radius when receiving the signal for adjusting the rotation radius of the rotating lens.

In an embodiment, the length adjusting support assembly further includes a support bar vertically connected with the telescopic slide bar mechanism, and one end of the support bar away from the telescopic slide bar mechanism is connected with the rotating lens.

In an embodiment, the support bar includes a first support bar vertically connected with the telescopic slide bar mechanism.

In an embodiment, the support bar further includes a second support bar, the first support bar and the second support bar are vertically connected with each other, and one end of the second support bar away from the first support bar is connected with the rotating lens.

In an embodiment, the telescopic slide bar mechanism includes a slide bar, an adjusting assembly connected with the slide bar, and a control assembly connected with the adjusting assembly and configured to control the adjusting assembly to adjust the length of the slide bar after receiving the signal for adjusting the rotation radius of the rotating lens.

In an embodiment, the second support bar is parallel to the slide bar.

In an embodiment, the beam emission assembly includes a laser and a mirror, an emission end of the laser is set toward the mirror, and the mirror is set toward the laser and the rotating lens and configured to reflect the beam received from the laser to the rotating lens.

In an embodiment, the driving mechanism is a motor.

In an embodiment, the rotating lens includes one or more of a spherical mirror, an aspherical mirror, and a lens.

According to a second aspect, a control method for mass transfer is provided. The method includes the following. An instruction for mass transfer of microelements is received. A first signal for controlling a rotation speed of the driving mechanism is transmitted to a driving mechanism according to the instruction. A second signal for controlling a rotation radius of a rotating lens is transmitted to a rotating lens adjusting assembly according to a rotation radius parameter of the rotating lens. A third signal for controlling a beam emission period of the beam emission assembly is transmitted to a beam emission assembly according to a rotation speed of the driving mechanism.

In an embodiment, the second signal is used to control the rotating lens adjusting assembly to continuously adjust the rotation radius of the rotating lens according to a preset rule.

In an embodiment, the second signal is used to control the rotating lens adjusting assembly to intermittently adjust the rotation radius of the rotating lens.

According to a third aspect, a mass transfer system is provided. The mass transfer system includes the mass transfer apparatus described above and a processor. The processor is electrically connected with the driving mechanism, the rotating lens adjusting assembly, and the beam emission assembly and configured to electrically transmit a first signal to the driving mechanism, a second signal to the rotating lens adjusting assembly, and a third signal to the beam emission assembly.

DESCRIPTION OF REFERENCE SIGNS

Figure 1:
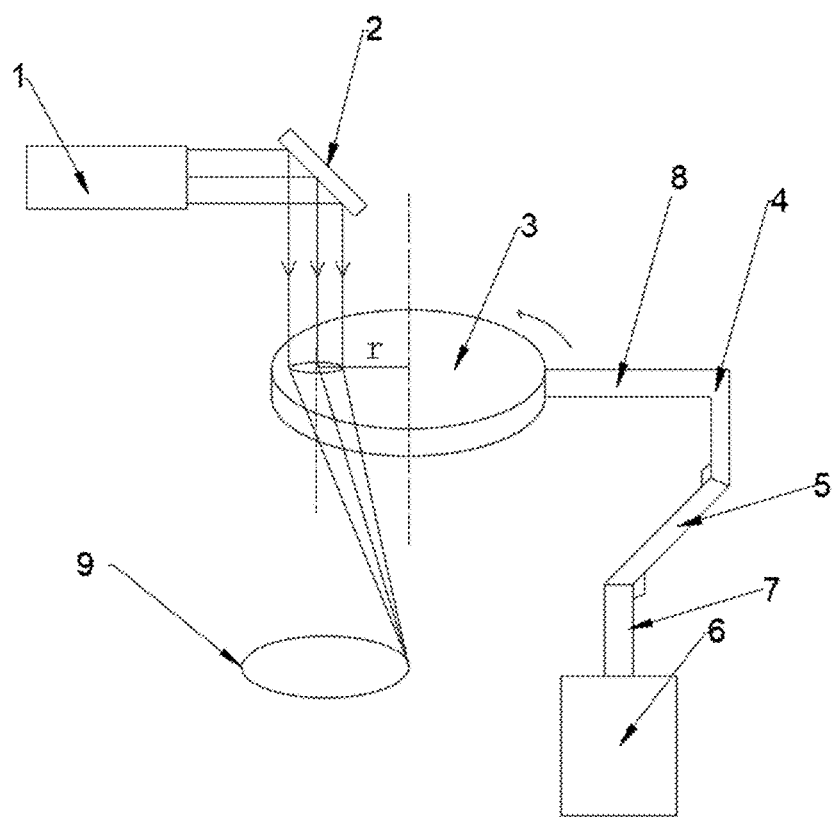
FIG. 1 is a structural diagram of a mass transfer apparatus according to an embodiment of the present application.

1—laser, 2—mirror, 3—rotating lens, 4—first support bar, 5—telescopic slide bar mechanism, 6—driving motor, 7—rotation axis, 8—second support bar, 9—spot.

DETAILED DESCRIPTION

In order to facilitate the understanding of the present application, the present application will be described more fully below with reference to the relevant drawings. Some embodiments of the present application are shown in the drawings. However, the present application can be implemented in many different forms and is not limited to the embodiments described herein. Instead, these embodiments are provided for a complete understanding of the present application.

Unless otherwise defined, all technical and scientific terminology used herein have the same meaning as commonly understood by those skilled in the technical field of the present application. The terminology used in the specification of the present application herein is only for describing some embodiments, and is not intended to limit the present application.

In the related art, a laser lift-off technology is generally used to carry out the mass transfer of micro-LEDs. LED assemblies to be transferred include a release layer, an adhesive layer, an LED chip, a first temporary substrate, and a second temporary substrate. The release layer can be formed by using, for example, fluorine coating, silicone resin, water-soluble adhesive (such as PVA), poly Imide, etc. The laser selectively irradiates the release layer where the LED to be transferred locates to make it lose its viscosity or vaporize directly, so that the LED to be transferred is stripped off from the first temporary substrate and adhered to the second temporary substrate.

The laser lift-off technology currently used for micro-LED is the galvanometer scanning method. The position of a spot 9 is controlled by controlling mirrors 2 in X-axis and Y-axis. It is sensitive to external vibration, stress, and motor accuracy, so it is difficult to realize precise control of the trajectory of the spot 9.

Based on this, the present application provides a solution to solve the above technical problems, the details of which will be described in the following embodiments.

In the present application, a display backplane may include multiple microelements in an array of M rows and N columns, and each micro-LED microelement is a miniaturized LED element, such as a red light (R) chip, blue light (B) chip, green light (G) chip, used for manufacturing a micro-LED display.

A mass transfer apparatus is provided. The mass transfer apparatus is applied to mass transfer of microelements and includes a beam emission assembly, a rotating lens 3, and a rotating lens adjusting assembly.

The beam emission assembly is configured to emit a beam. The rotating lens 3 is configured to receive the beam emitted from the beam emission assembly and refract the beam to a substrate carrying a micro light emitting diode (LED) chip to be stripped. The rotating lens adjusting assembly is connected with the rotating lens 3 and configured to control the rotating lens 3 to perform peripheral rotation and adjust a rotation radius of the rotating lens 3.

In an example, the mass transfer apparatus includes the beam emission assembly configured to emit the beam. The beam emission assembly includes a laser 1 and a mirror 2. An emission end of the laser 1 is set toward the mirror 2. The mirror 2 is set obliquely toward the laser 1 and the rotating lens 3 and configured to reflect the beam received from the laser 1 to the rotating lens 3. As shown in FIG. 1, the laser 1 outputs a collimated beam, which is reflected at the mirror 2, and the reflected light reaches the rotating lens 3 set under the mirror. The rotating lens 3 can be a combination of a spherical mirror, an aspherical mirror, and a lens. Below the rotating lens 3 are microelement assemblies to be massively transferred. The reflected light passes through the rotating lens 3 and is then refracted. The refracted light exits to the microelement assemblies below. When the light irradiated on LED chips on the microelement assemblies needs to be adjusted according to the position of the LED chips, the rotation radius of the rotating lens 3 is adjusted, so that a trajectory of the refraction spot 9 can be adjusted.

In this embodiment, the mass transfer apparatus further includes the rotating lens adjusting assembly. The rotating lens adjusting assembly is connected with the rotating lens 3 and is configured to adjust the rotation radius of the rotating lens 3. The rotating lens adjusting assembly is configured to control the rotating lens 3 to perform a peripheral rotation, for example, to rotate around a vertical axis perpendicular to the rotating lens 3 to perform a circular motion. During the rotation of the rotating lens 3, light reaches the rotating lens 3 and is refracted onto the microelement assemblies to be massively transferred, where the path of the light on the microelement assemblies is also a circle. When the rotation radius of the rotating lens 3 changes, the path of the spot 9 will also change. When the rotation radius becomes smaller, the radius of the circle formed by the trajectory of the spot 9 will also become smaller. When the rotation radius changes continuously, the trajectory of spot 9 forms a spiral with a continuously changing radius.

In the embodiment, the path of the rotating lens 3 can be changed by adjusting the rotating lens adjusting assembly, and thus the path of spot 9 of the light exits from the rotating lens 3 onto the microelement assemblies to be massively transferred can be adjusted. In the present application, the path of the spot 9 can be adjusted by adjusting only the rotation radius of the rotating lens 3. That is, only the element in one axis of the rotating lens 3 is controlled. Compared with the related method where elements in two axes are controlled, the accuracy is easier to control. As such, the control accuracy of the mass transfer apparatus can be improved.

In an embodiment, the rotating lens adjusting assembly includes a driving mechanism and a length adjusting support assembly with one end connected with the driving mechanism and the other end connected with the rotating lens 3. The length adjusting support assembly is configured to rotate around a rotation axis 7 of the driving mechanism driven by the driving mechanism, so that the rotating lens 3 rotates around the rotation axis 7 of the driving mechanism along with the length adjusting support assembly, and adjust the length of a part thereof connected with the driving mechanism to control the rotation radius of the rotating lens 3 when receiving a signal for adjusting the rotation radius of the rotating lens.

In this embodiment, the rotating lens adjusting assembly includes the length adjusting support assembly and the driving mechanism. The driving mechanism is a driving motor 6. The driving motor 6 is configured to control the rotation of the length adjusting support assembly. Under the control of the driving motor 6, the length adjusting support assembly rotates around the rotation axis 7 of the driving motor 6. The length adjusting support assembly is connected with the rotating lens 3. Driven by the rotation of the length adjusting support assembly, the rotating lens 3 will also rotate around the rotation axis 7 of the driving motor 6.

The length adjusting support assembly has a part directly connected with the driving motor 6. The length of this part is related to the rotation radius of the rotating lens 3. The rotation radius of the rotating lens 3 can be adjusted by changing the length of this part, so that the trajectory of the spot 9 can be adjusted.

In an example, the length adjusting support assembly includes a telescopic slide bar mechanism 5 that is length-adjustable and connected with the driving mechanism. The length adjusting support assembly is configured to adjust the length of the telescopic slide bar mechanism 5 to adjust the rotation radius when receiving the signal for adjusting the rotation radius of the rotating lens 3.

It can be understood that the telescopic slide bar mechanism 5 is the part of the length adjusting support assembly that is directly connected with the driving motor 6. Since the length of the telescopic slide bar mechanism 5 is adjustable, the length of the telescopic slide bar mechanism 5 can be adjusted, to adjust the rotation radius of the rotating lens 3.

A length adjusting method of the telescopic slide bar mechanism 5 can be an automatic adjusting method. The length of the telescopic slide bar mechanism 5 can be adjusted upon the receipt of an adjusting signal. The automatic adjusting method can simplify the entire adjusting mechanism and make the apparatus more intelligent. The trajectory of the spot 9 can be calculated by a user according to the position of the LED assembly, and then the rotation radius of the rotating lens 3 can be calculated. Then, a corresponding signal can be sent to the telescopic slide bar mechanism 5 to adjust the length of the telescopic slide bar mechanism 5 to a corresponding length.

The automatic adjusting method of the telescopic slide bar mechanism 5 can be various. The length can be adjusted with a slide rail. That is, the telescopic slide bar mechanism 5 includes a slide rail and a slide bar disposed on the slide rail. The slide bar is connected with a driving apparatus configured to drive the slide bar to slide on the slide rail. In this example, the support bar is connected onto the slide bar, and the rotation axis 7 of the driving motor 6 is connected to the slide rail. The length of the slide rail remains unchanged. When the slide bar is moving on the slide rail, the slide bar can extend out of the slide rail more. In case of an unchanged length of the slide rail, the total length of the slide bar and the slide rail becomes longer. In this way, the rotation radius of the rotating lens 3 can be adjusted by adjusting the length of the telescopic slide bar mechanism 5.

The length adjusting support assembly further includes a support bar vertically connected with the telescopic slide bar mechanism 5, and one end of the support bar away from the telescopic slide bar mechanism 5 is connected with the rotating lens 3.

As shown in FIG. 1, the length adjusting support assembly has a part connected with driving mechanism, and the part is the telescopic slide bar mechanism 5. The other end of the telescopic slide bar mechanism 5 is connected with the support bar, and the support bar is vertically connected onto the telescopic slide bar mechanism 5. It can be understood that when the driving motor 6 rotates, the telescopic slide bar mechanism 5 rotates with the driving motor 6. When rotating, the telescopic slide bar mechanism 5 will drive the support bar connected therewith to rotate. When rotating, the support bar will drive the rotating lens 3 connected therewith to rotate. In this way, the telescopic slide bar mechanism 5, the support bar, and the rotating lens 3 will rotate, i.e., perform circular motion around the rotation axis 7 of the driving motor 6. It should be noted that the telescopic slide bar mechanism 5 can be connected with the driving motor 6 in such a way that the telescopic slide bar mechanism 5 is disposed horizontally and is vertically connected onto the vertical rotation axis 7 of the driving motor 6. It can be understood that when the telescopic slide bar mechanism 5, the support bar, and the rotating lens 3 perform circular motion, the radius of the circular motion is equal to the length of the telescopic slide bar mechanism 5. Therefore, when the rotation radius of the rotating lens 3 needs to be adjusted, only the length of the telescopic slide bar mechanism 5 needs to be adjusted. The structure of the rotating lens adjusting assembly described herein is simple and easy to implement.

Figure 2:
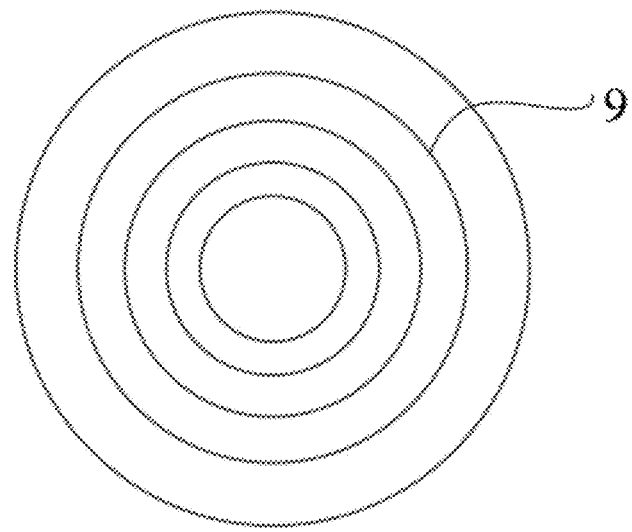
FIG. 2 is a diagram of a spot trajectory according to an embodiment of the present application.
Figure 3:
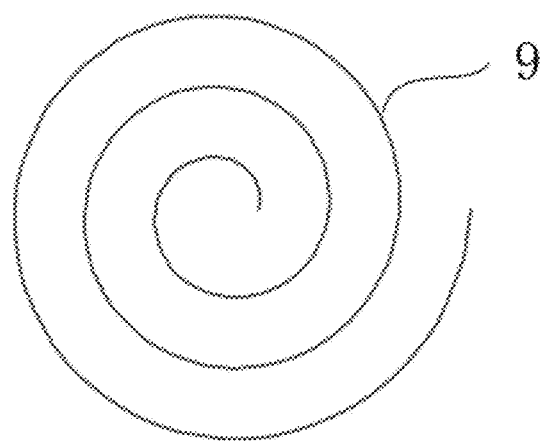
FIG. 3 is a diagram of a spot trajectory according to another embodiment of the present application.

It should be noted that the adjusting of the radius of the rotating lens 3 can be intermittent adjusting or continuous adjusting. When the radius of the rotating lens 3 is adjusted intermittently, the image of the spot 9 obtained is shown in FIG. 2, which is a number of concentric circles with different radii. When the radius of the rotating lens 3 is adjusted continuously, the image of the spot 9 obtained is shown in FIG. 3, which is a spiral.

Further, the support bar includes a first support bar 4 vertically connected with the telescopic slide bar mechanism 5. It should be noted that the other end of the first support bar 4 away from the telescopic slide bar mechanism 5 is connected with the rotating lens 3. In this case, the rotating lens 3 can be detachably connected to the top of the first support bar 4 or fixedly connected to the top of the first support bar 4.

In another embodiment, the support bar further includes a second support bar 8, the first support bar 4 and the second support bar 8 are vertically connected with each other, and one end of the second support bar 8 away from the first support bar 4 is connected with the rotating lens 3. The introduction of the second support bar 8 improves the supporting effect of the support bar on the rotating lens 3, thereby improving the stability of the entire apparatus.

Further, the telescopic slide bar mechanism 5 includes a slide bar, an adjusting assembly connected with the slide bar, and a control assembly connected with the adjusting assembly and configured to control the adjusting assembly to adjust the length of the slide bar after receiving the signal for adjusting the rotation radius of the rotating lens 3. In this embodiment, the telescopic slide bar mechanism 5 includes the slide bar, the adjusting assembly, and the control assembly. The adjusting assembly is connected with the control assembly. The adjusting assembly is configured to adjust the length of the slide bar. The control assembly is configured to receive the signal for adjusting the rotation radius of the rotating lens 3 sent by a control system, and control the operation of the adjusting assembly to adjust the length of the slide bar according to this signal.

Figure 4:
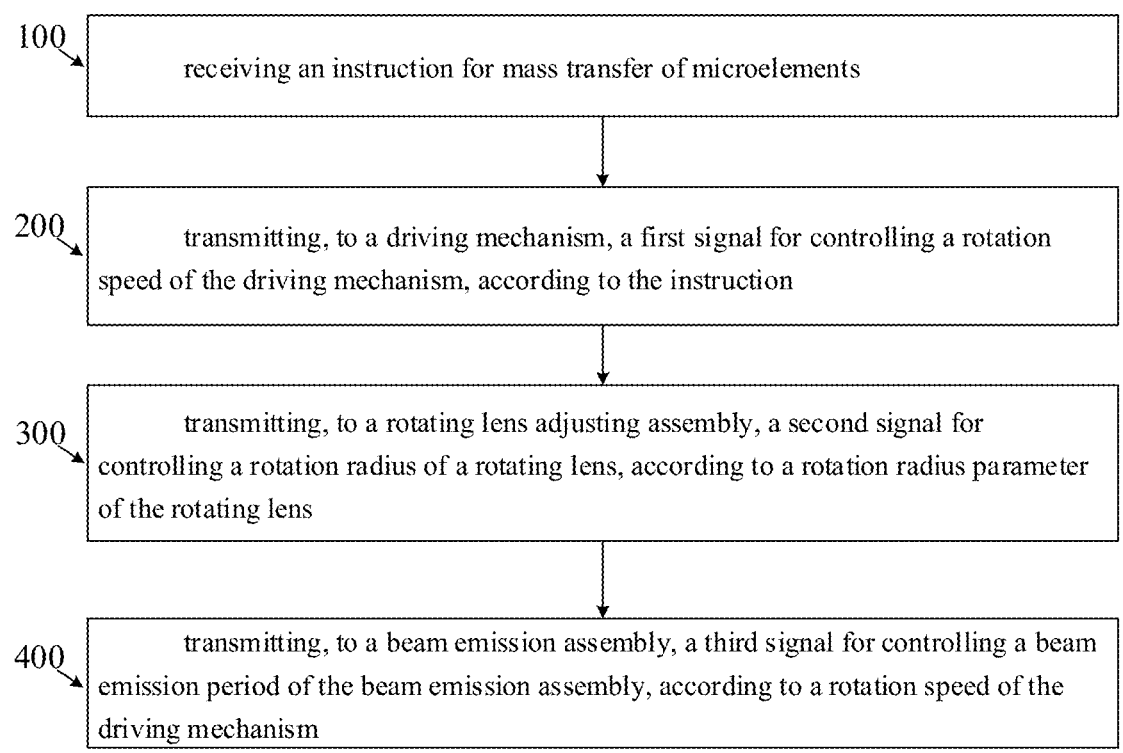
FIG. 4 is a flow chart of a control method for mass transfer according to an embodiment of the present application.

In addition, a control method for mass transfer is provided, as shown in FIG. 4. The method includes the following.

At block 100, an instruction for mass transfer of microelements is received.

At block 200, a first signal for controlling a rotation speed of the driving mechanism is transmitted to a driving mechanism according to the instruction.

At block 300, a second signal for controlling a rotation radius of a rotating lens 3 is transmitted to a length adjusting support assembly according to a rotation radius parameter of the rotating lens 3.

At block 400, a third signal for controlling a beam emission period of the beam emission assembly is transmitted to a beam emission assembly according to a rotation speed of the driving mechanism.

An instruction to perform mass transfer of microelements is transmitted to the control system by the user. After receiving the instruction, the control system transmits the first signal to the driving motor 6. The first signal is used to control the rotation speed of the driving motor 6. The control system further transmits the second signal to the telescopic slide bar mechanism 5. The second signal is used to control the telescopic slide bar mechanism 5 to adjust the length of the slide bar according to the rotation radius of the rotating lens 3.

A laser pulse signal is output to the laser 1 in accordance with the rotation speed of the driving motor 6 controlled via the first signal. In this way, when a laser trajectory arrives at the position of the LED chip to be transferred, the laser 1 is turned on so that the LED chip to be transferred is separated from the first temporary substrate. When the laser trajectory arrives at the position of another LED chip that does not need to be transferred, laser 1 is turned off so that the LED chip that does not need to be transferred remains on the first temporary substrate.

It should be noted that the adjusting of the radius of the rotating lens 3 can be intermittent adjusting or continuous adjusting. When the radius of the rotating lens 3 is adjusted intermittently, the image of the spot 9 obtained is shown in FIG. 2, which is a number of concentric circles with different radii. When the radius of the rotating lens 3 is adjusted continuously, the image of the spot 9 obtained is shown in FIG. 3, which is a spiral. Whether to perform intermittent adjusting or continuous adjusting can be determined according to the position of the LED chip. These parameters can be set in the control system. After the parameters are set, the mass transfer apparatus will operate according to the set parameters.

In addition, a mass transfer system is provided. The mass transfer system includes the mass transfer apparatus described above and a processor. The processor is electrically connected with the driving mechanism, the rotating lens adjusting assembly, and the beam emission assembly and is configured to electrically transmit a first signal to the driving mechanism, a second signal to the rotating lens adjusting assembly, and a third signal to the beam emission assembly.

The processor is configured to transmit a first signal to the driving motor 6. The first signal is used to control the rotation speed of the driving motor 6. A second signal is transmitted to the telescopic slide bar mechanism 5. The second signal is used to control the telescopic slide bar mechanism 5 to adjust the length of the slide bar according to the rotation radius of the rotating lens 3.

A laser pulse signal is output to the laser 1 in accordance with the rotation speed of the driving motor 6 controlled via the first signal. In this way, when a laser trajectory arrives at the position of the LED chip to be transferred, laser 1 is turned on so that the LED chip to be transferred is separated from the first temporary substrate. When the laser trajectory arrives at the position of another LED chip that does not need to be transferred, laser 1 is turned off so that the LED chip that does not need to be transferred remains on the first temporary substrate.

It should be understood that the application scenarios of the present application are not limited to the above examples. For those of ordinary skill in the art, improvements or changes can be made based on the above description, and all these improvements and changes should fall within the protection scope of the appended claims of the present application.

What is claimed is:
1. A mass transfer apparatus, comprising:
  a beam emission assembly configured to emit a beam;
  a rotating lens configured to:
    receive the beam emitted from the beam emission assembly; and
    refract the beam to a substrate carrying a micro light emitting diode (LED) chip to be stripped; and
  a rotating lens adjusting assembly connected with the rotating lens and configured to:
    control the rotating lens to perform peripheral rotation; and
    adjust a rotation radius of the rotating lens.
2. The mass transfer apparatus of claim 1, wherein the rotating lens adjusting assembly comprises:
  a driving mechanism; and
  a length adjusting support assembly with one end connected with the driving mechanism and another end connected with the rotating lens, configured to:
    rotate around a rotation axis of the driving mechanism driven by the driving mechanism, so that the rotating lens rotates around the rotation axis of the driving mechanism along with the length adjusting support assembly; and
    adjust the length of a part thereof connected with the driving mechanism to control the rotation radius of the rotating lens when receiving a signal for adjusting the rotation radius of the rotating lens.
3. The mass transfer apparatus of claim 2, wherein the length adjusting support assembly comprises a telescopic slide bar mechanism that is length-adjustable and connected with the driving mechanism, and the length adjusting support assembly is configured to:

adjust the length of the telescopic slide bar mechanism to adjust the rotation radius when receiving the signal for adjusting the rotation radius of the rotating lens.

4. The mass transfer apparatus of claim 3, wherein the length adjusting support assembly further comprises a support bar vertically connected with the telescopic slide bar mechanism, and one end of the support bar away from the telescopic slide bar mechanism is connected with the rotating lens.

5. The mass transfer apparatus of claim 4, wherein the support bar comprises a first support bar vertically connected with the telescopic slide bar mechanism.

6. The mass transfer apparatus of claim 5, wherein the support bar further comprises a second support bar, the first support bar and the second support bar are vertically connected with each other, and one end of the second support bar away from the first support bar is connected with the rotating lens.

7. The mass transfer apparatus of claim 6, wherein the telescopic slide bar mechanism comprises:
a slide bar;
a slide-bar adjusting assembly connected with the slide bar; and
a control assembly connected with the slide-bar adjusting assembly and configured to:
control the slide-bar adjusting assembly to adjust the length of the slide bar after receiving the signal for adjusting the rotation radius of the rotating lens.

8. The mass transfer apparatus of claim 7, wherein the second support bar is parallel to the slide bar.

9. The mass transfer apparatus of claim 2, wherein the driving mechanism is a motor.

10. The mass transfer apparatus of claim 1, wherein the beam emission assembly comprises a laser and a mirror, an emission end of the laser is set toward the mirror, and the mirror is set toward the laser and the rotating lens and configured to reflect the beam received from the laser to the rotating lens.

11. The mass transfer apparatus of claim 1, wherein the rotating lens comprises one or more of a spherical mirror, an aspherical mirror, and a lens.

12. A control method for mass transfer, comprising:
receiving an instruction for mass transfer of microelements;
transmitting, to a driving mechanism, a first signal for controlling a rotation speed of the driving mechanism, according to the instruction;
transmitting, to a rotating lens adjusting assembly, a second signal for controlling a rotation radius of a rotating lens, according to a rotation radius parameter of the rotating lens;
transmitting, to a beam emission assembly, a third signal for controlling a beam emission period of the beam emission assembly, according to a rotation speed of the driving mechanism.

13. The method of claim 12, wherein the second signal is used to control the rotating lens adjusting assembly to continuously adjust the rotation radius of the rotating lens according to a preset rule.

14. The method of claim 12, wherein the second signal is used to control the rotating lens adjusting assembly to intermittently adjust the rotation radius of the rotating lens.

15. A mass transfer system, comprising:
a mass transfer apparatus comprising:
a beam emission assembly configured to emit a beam;
a rotating lens configured to:
receive the beam emitted from the beam emission assembly; and
refract the beam to a substrate carrying a micro light emitting diode (LED) chip to be stripped; and
a rotating lens adjusting assembly connected with the rotating lens and configured to:
control the rotating lens to perform peripheral rotation; and
adjust a rotation radius of the rotating lens; and
a processor electrically connected with a driving mechanism of the rotating lens adjusting assembly, the rotating lens adjusting assembly, and the beam emission assembly and configured to electrically transmit a first signal to the driving mechanism, a second signal to the rotating lens adjusting assembly, and a third signal to the beam emission assembly.

16. The mass transfer apparatus of claim 15, wherein the rotating lens adjusting assembly further comprises:
a length adjusting support assembly with one end connected with the driving mechanism and another end connected with the rotating lens, configured to:
rotate around a rotation axis of the driving mechanism driven by the driving mechanism, so that the rotating lens rotates around the rotation axis of the driving mechanism along with the length adjusting support assembly; and
adjust the length of a part thereof connected with the driving mechanism to control the rotation radius of the rotating lens when receiving a signal for adjusting the rotation radius of the rotating lens.

17. The mass transfer apparatus of claim 16, wherein the length adjusting support assembly comprises a telescopic slide bar mechanism that is length-adjustable and connected with the driving mechanism, and the length adjusting support assembly is configured to:
adjust the length of the telescopic slide bar mechanism to adjust the rotation radius when receiving the signal for adjusting the rotation radius of the rotating lens.

18. The mass transfer apparatus of claim 17, wherein the length adjusting support assembly further comprises a support bar vertically connected with the telescopic slide bar mechanism, and one end of the support bar away from the telescopic slide bar mechanism is connected with the rotating lens.

19. The mass transfer apparatus of claim 18, wherein the support bar comprises a first support bar vertically connected with the telescopic slide bar mechanism.

20. The mass transfer apparatus of claim 19, wherein the support bar further comprises a second support bar, the first support bar and the second support bar are vertically connected with each other, and one end of the second support bar away from the first support bar is connected with the rotating lens.

* * * * *